(12) United States Patent
Singh

(10) Patent No.: US 6,748,650 B2
(45) Date of Patent: Jun. 15, 2004

(54) METHOD FOR MAKING A CIRCUIT ASSEMBLY HAVING AN INTEGRAL FRAME

(75) Inventor: Harvinder Singh, Shelby Township, MI (US)

(73) Assignee: Visteon Global Technologies, Inc., Dearborn, MI (US)

( * ) Notice: Subject to any disclaimer, the term of this patent is extended or adjusted under 35 U.S.C. 154(b) by 0 days.

(21) Appl. No.: 09/894,303

(22) Filed: Jun. 27, 2001

(65) Prior Publication Data

US 2003/0000723 A1 Jan. 2, 2003

(51) Int. Cl.[7] ................................................. H05K 3/30
(52) U.S. Cl. ........................ 29/841; 29/25.01; 29/827; 29/846; 29/830; 174/52.2; 174/266; 264/272.15; 264/272.11
(58) Field of Search .......................... 29/841, 848, 846, 29/856, 827, 832, 836, 855, 25.01; 174/260, 262, 266, 52.2; 264/272.15, 272.11; 361/424; 439/625

(56) References Cited

U.S. PATENT DOCUMENTS

| | | | |
|---|---|---|---|
| 4,149,301 A | * 4/1979 | Cook .......................... 29/25.42 |
| 4,810,048 A | 3/1989 | Asano et al. ............. 350/96.11 |
| 4,857,483 A | 8/1989 | Steffen et al. ............... 437/209 |
| 4,904,429 A | 2/1990 | Takahashi et al. .......... 264/46.7 |
| 4,933,744 A | * 6/1990 | Segawa et al. ................ 357/72 |
| 4,944,908 A | 7/1990 | Leveque et al. ............. 264/232 |
| 4,965,933 A | 10/1990 | Mraz et al. ..................... 29/882 |
| 5,373,627 A | * 12/1994 | Grebe ........................... 29/841 |
| 5,462,622 A | 10/1995 | Small et al. ................. 156/245 |
| 5,492,586 A | * 2/1996 | Groczyca ..................... 156/245 |
| 5,496,435 A | * 3/1996 | Abbott .......................... 29/827 |
| 5,564,181 A | * 10/1996 | Dineen et al. ................ 29/841 |
| 5,640,746 A | * 6/1997 | Knecht et al. ................ 29/841 |
| 5,773,322 A | * 6/1998 | Weld ........................... 438/117 |
| 6,007,317 A | 12/1999 | Mess ........................... 425/125 |
| 6,010,956 A | * 1/2000 | Takiguchi et al. ........... 438/623 |
| 6,058,602 A | * 5/2000 | Fehr .............................. 29/827 |
| 6,100,484 A | 8/2000 | Houze et al. ................ 200/512 |
| 6,266,872 B1 | * 7/2001 | Fjelstad ........................ 29/832 |

* cited by examiner

*Primary Examiner*—Carl J. Arbes
*Assistant Examiner*—Minh Trinh
(74) *Attorney, Agent, or Firm*—Brinks Hofer Gilson & Lione

(57) ABSTRACT

A circuit assembly comprises a substrate comprising one or more conductors. An integral frame of frame elements supports the substrate. The frame elements spaced apart to expose intervening regions of the substrate between adjacent frame elements. A dielectric layer overlies the intervening regions, as a protective barrier for at least one of the conductors, a component, and a circuit feature of the substrate.

13 Claims, 11 Drawing Sheets

METHOD FOR MAKING A CIRCUIT ASSEMBLY HAVING AN INTEGRAL FRAME

FIELD OF THE INVENTION

This invention relates to a circuit assembly having an integral frame and a method of making the circuit assembly.

BACKGROUND

In the prior art, a circuit assembly may be formed of a substrate that is encapsulated with an encapsulation layer to protect the substrate and circuit features from dust, dirt, debris, or unwanted electrical contact. For example, an injection molding process may be used to cover a flexible substrate with a protective encapsulation layer. The substrate may be aligned with respect to the mold sections of the injection molding apparatus to properly register the encapsulation layer with a substrate. However, if a substrate is relatively flexible and has low rigidity, the mechanical stress introduced by a molding operation may deform the substrate during molding. The deformation of the substrate may occur between pins or other hold-down devices associated with the substrate. Accordingly, the circuit assembly may perform unreliably because of circuit irregularities, including electrical shorts, electrical open circuits, or other deficiencies associated with deformation of the substrate of the circuit assembly. Even if the number of pins or hold-down devices per unit area of the substrate is increased to reduce warpage or buckling of the substrate during the encapsulation, localized buckling of the substrate may still occur. Moreover, the greater number of pins or hold-down devices may reduce the circuit density of the substrate by occupying space that could otherwise be used for circuit features. Hold-down pins may expose the substrate in a manner that makes the substrate more prone to damage from the external environment. Thus, the need exists for a circuit assembly that provides structural support to the substrate during the molding process to reduce or eliminate warpage of the substrate. Further, a need exists for protecting the circuit assembly from the deleterious of unwanted debris, dirt, conductive particles, and unwanted electrical contact.

SUMMARY

In accordance with the invention, a method for making a circuit assembly facilitates the formation of a reliable circuit assembly that preserves the planarity of a substrate. A substrate is provided comprising one or more conductors. An integral frame of frame elements is formed about the substrate to provide structural support to the substrate. The frame elements are spaced apart to expose intervening regions of the substrate between adjacent frame elements. A dielectric layer is constructed over the intervening regions as a protective barrier for at least one of the conductors, a component, and a circuit feature of the substrate.

DETAILED DESCRIPTION

Figure 1:
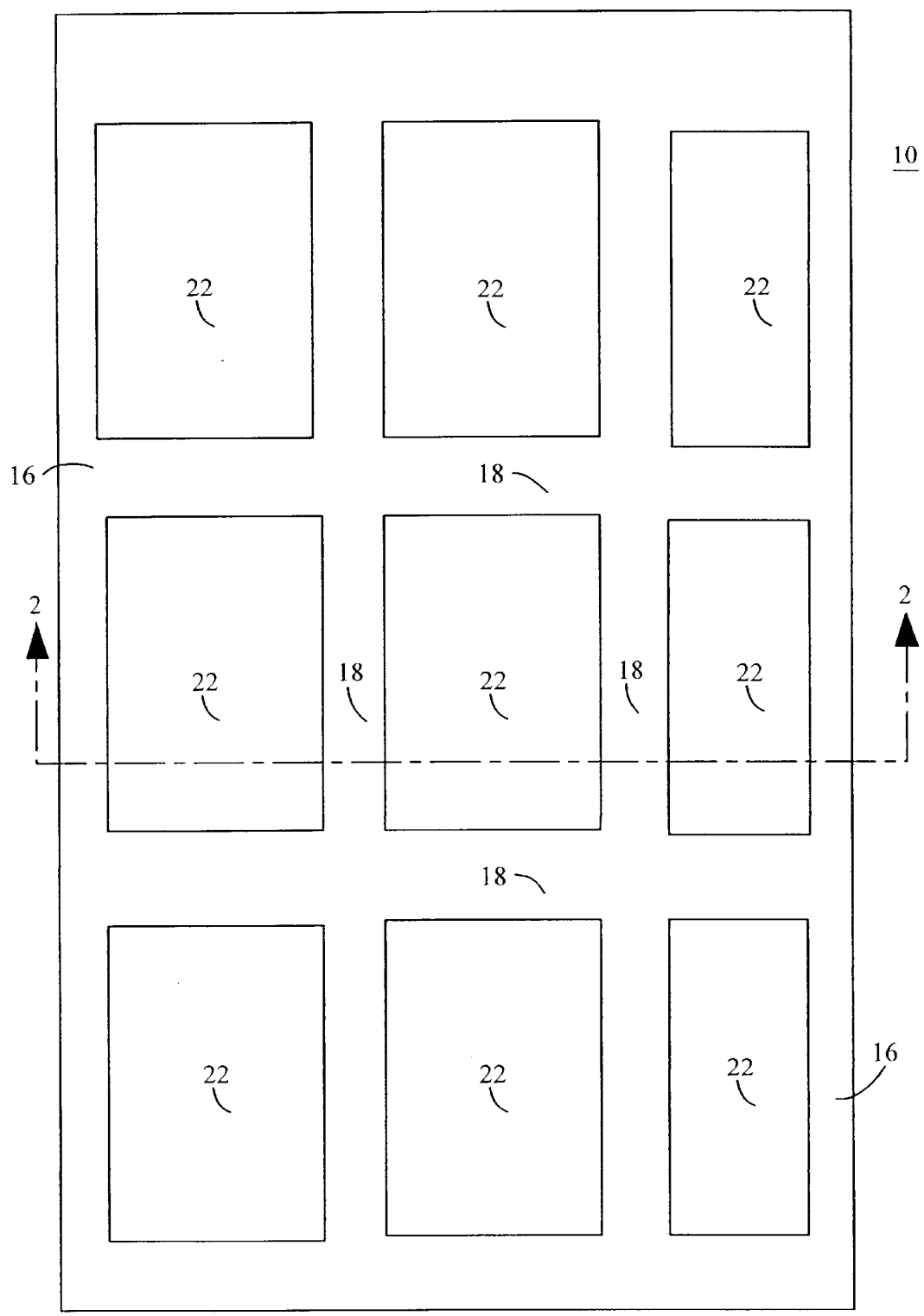
FIG. 1 is a top view of a first embodiment of a circuit assembly in accordance with the invention.
Figure 2:
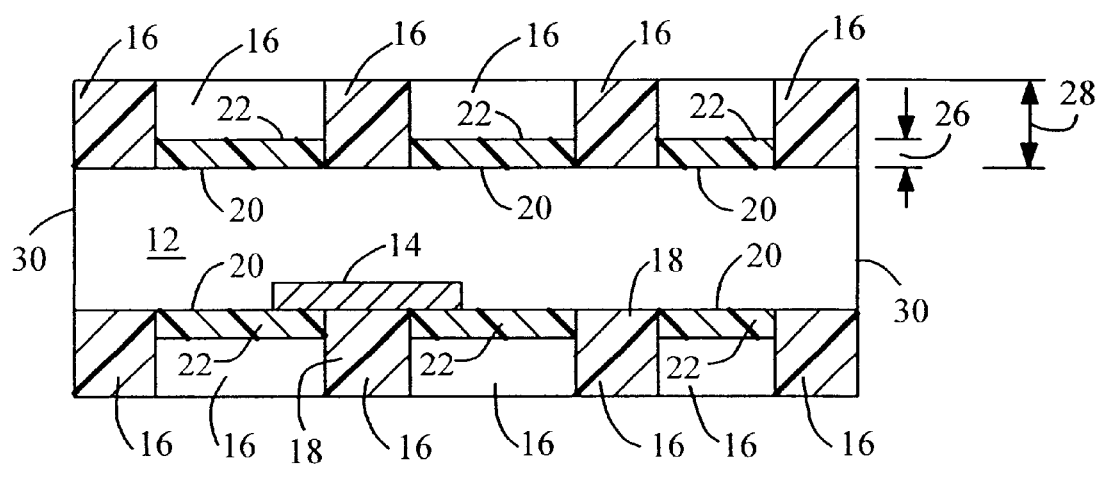
FIG. 2 is a cross-section of the circuit assembly as viewed along line 2—2 of FIG. 1.

In accordance with the invention, FIG. 1 and FIG. 2 show a circuit assembly 10. The circuit assembly 10 comprises a substrate 12 supported by an integral frame 16. The integral frame 16 includes frame elements 18 (e.g., ribs) that overly the substrate 12 to provide structural support for the substrate 12. The integral frame 16 may provide structural support for the substrate 12 during a molding process or an encapsulation process, for example. The frame elements 18 of the integral frame 16 are spaced apart to expose intervening regions 20 of a substrate 12 between adjacent frame elements 18. A dielectric layer 22 overlies the intervening regions 20. The dielectric layer 22 may be regarded as a protective barrier for one or more of the following: a conductor 14 associated with the substrate 12, a component mounted on the substrate 12, and a circuit feature of the substrate 12.

The substrate 12 may include one or more of the following: conductors 14, circuit features, electrical components, electronic components, semiconductor devices, chips, flip chips, ball-grid array chips, capacitors, chip resistors, inductors and any other circuit elements. For example, the substrate 12 may comprise a printed circuit board, a flexible electronic substrate (FEM), a flexible substrate, an FR-4 board, or the like. A flexible substrate may refer to a substrate that permits flexing or bending of the substrate or deformation of the substrate from a generally planar shape upon exposure to mechanical stress consistent in scope with that of a conventional molding process In one embodiment, the substrate 12 may comprise a lead frame. The lead frame is generally arranged to support a semiconductor device.

As shown in FIG. 1, the integral frame 16 comprises a matrix or a lattice. In an alternate embodiment, the integral frame may be shaped like a web, a trellis, a ladder-like structure, a waffle pattern, or some other geometric pattern. The integral frame 16 may be composed of a polymer, a plastic, a plastic composite, a polymeric composite, or another material that is sufficiently rigid to provide structural support for the substrate 12. The integral frame 16 comprises a rigid structure along at least an edge 30 of the substrate 12. The frame 16 has a group of ribs as frame elements 18 for holding the substrate 12 in place during a molding process or an encapsulation process. One or more cavities or depressions in the circuit assembly 10 is defined by boundaries of the integral frame 16.

The frame 16 or frame elements (e.g., ribs) of the frame provide electrical support to the flexible substrate. The geometry of the ribs depends upon the circuit assembly and the material characteristics.

The dielectric layer 22 may have a dielectric thickness 26 that is thinner than a frame thickness 28 of the frame. In one embodiment, the dielectric layer 22 may comprise a flexible polymer or an elastomer. In another embodiment, the dielectric layer 22 may be composed of the same material as the integral frame 16. Use of the same material may improve manufacturing economies of scale. The geometry of the dielectric layer 22 depends upon the selected material and the geometry of the ribs or the frame 16. The dielectric layer 22 provides a layer of protection and/or electrical isolation for the circuit assembly. The geometries of the ribs and the dielectric layer 22 are a function of material and component requirements.

FIG. 2 is a cross-section of the circuit assembly 10 of FIG. 1 taken along reference line 2—2 of FIG. 1. The substrate 12 of FIG. 2 may represent an unpopulated substrate 12 as there are no components mounted on either side of the substrate 12. Like reference numbers in FIG. 1 and FIG. 2 indicate like elements. FIG. 2 shows cross-sections of the frame elements 18 and cross-sections of the dielectric layer 22.

Figure 3:
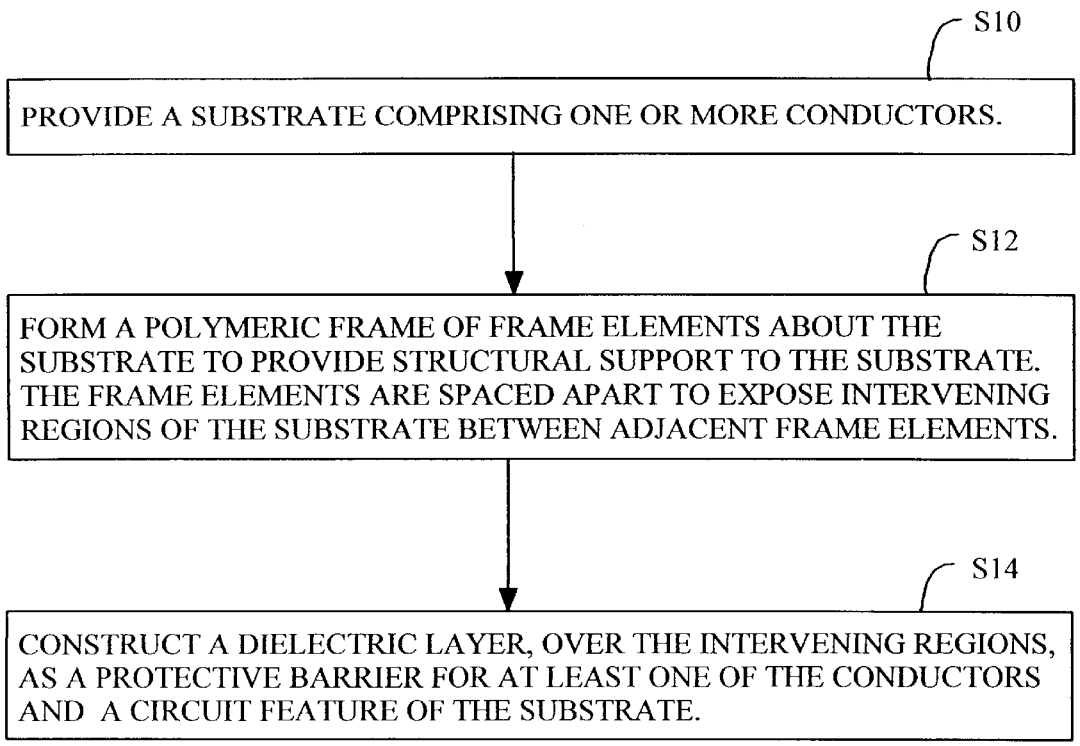
FIG. 3 is a flow diagram of a method for making a circuit assembly in accordance with the invention.

FIG. 3 is a flowchart of a method for making a circuit assembly in accordance with the invention. The method of FIG. 3 starts in step S10.

In step S10, a substrate (e.g., substrate 12) comprises one or more conductors. The conductors (e.g., conductors 14) may represent one or more of the following: conductive traces, stripline, microstrip, transmission line, conductive pads, plating, conductive planes, plated vias, plated through-holes, wires, conductive adhesive, or other conductive features of the substrate. In one example, the substrate comprises a printed circuit board having a ground plane, conductive traces, a dielectric layer, and other circuit features. In another example, the substrate comprises an interposer or a lead frame for a semiconductor device.

In step S12, an integral frame (e.g., integral frame 16) is formed of frame elements bonded to the substrate, fused to the substrate, or otherwise attached to the substrate to provide structural support to the substrate. The frame elements are spaced apart to expose intervening regions (e.g., intervening regions 20) of the substrate between adjacent frame elements. For example, the frame may be molded by an injection molding process in which sections of female molds are brought together to form the integral frame. The geometry of the integral frame affords a lower molding pressure than a higher molding pressure that would be required to encapsulate the entire substrate. Accordingly, the integral frame supports lower molding pressures that preserve the planarity of the substrate to enhance circuit reliability and electrical performance, even where a flexible substrate is used in the formation of the circuit assembly.

In step S14 a dielectric layer (e.g., dielectric layer 22) is constructed over intervening regions. The dielectric layer forms a protective barrier for one or more of the following: a conductor of the substrate, a circuit feature of the substrate, and a component of the substrate.

Figure 4:
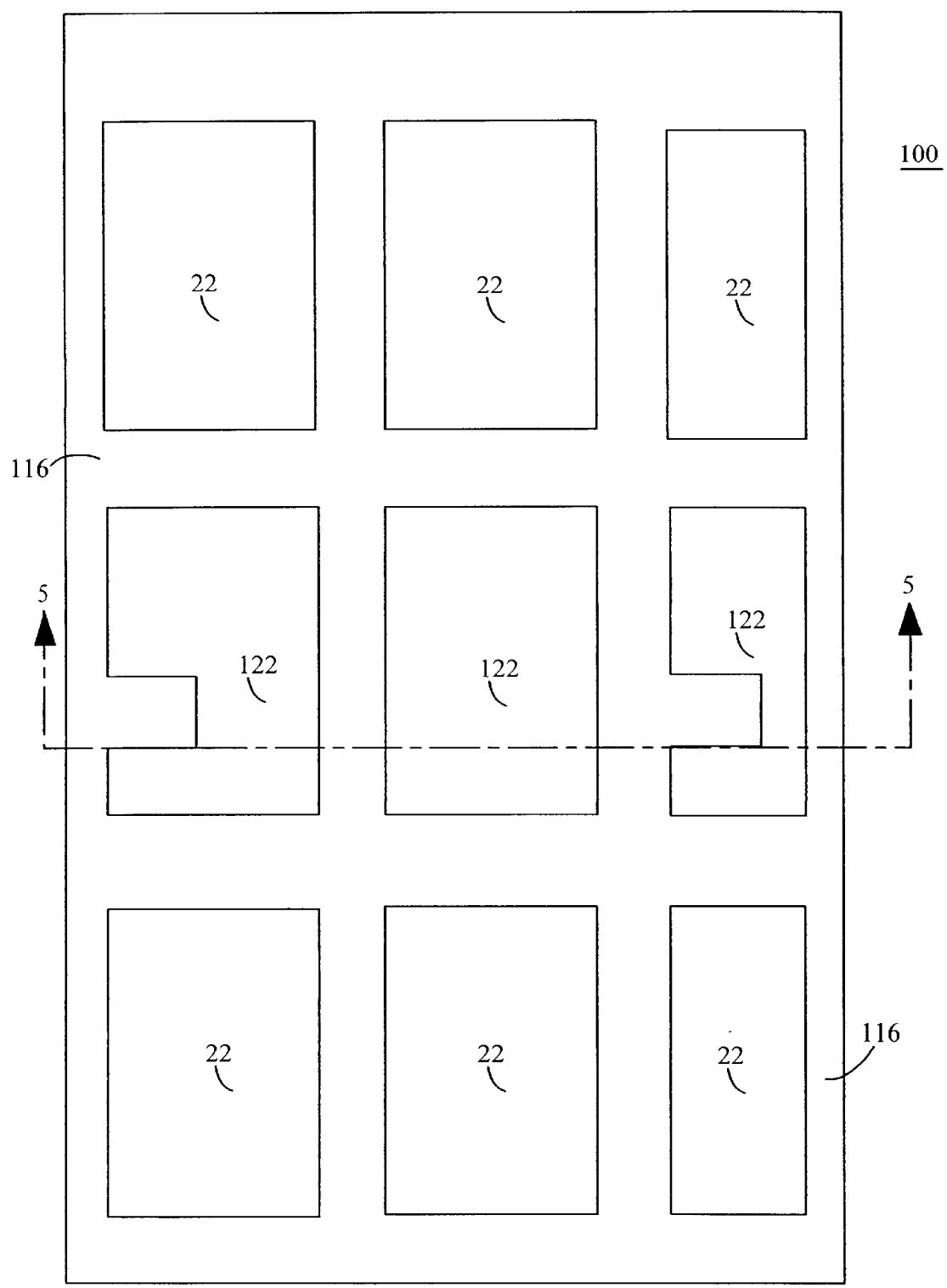
FIG. 4 is a top view of a second embodiment of a circuit assembly in accordance with the invention.
Figure 5:
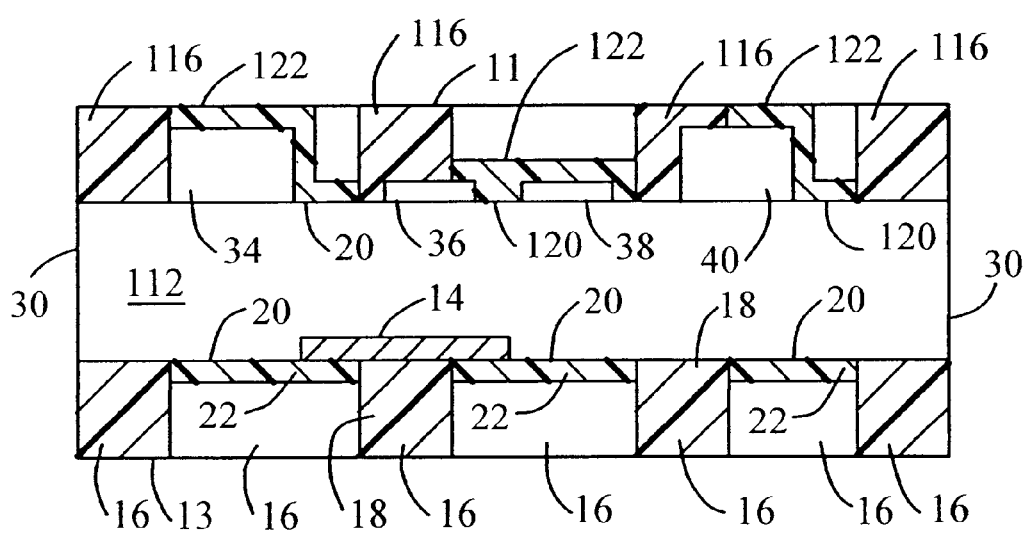
FIG. 5 is shows a cross-section of the circuit assembly along reference line 5—5 of FIG. 4.

FIG. 4 and FIG. 5 show a second embodiment of a circuit assembly 100 in accordance with the invention. The circuit assembly 100 of FIG. 4 is similar to the circuit assembly 10 of FIG. 1, except the circuit assembly 100 of FIG. 4 includes a substrate 112 that is populated with components on one side. Like reference numbers in FIG. 1, FIG. 2, FIG. 4 and FIG. 5 indicate like elements.

Because the circuit assembly 100 of FIG. 4 is populated on one side, one or more elevated regions may protrude from the intervening regions 120 of the substrate 112. The dielectric layer 122 may include elevated regions that overlie a circuit feature or a component mounted on the substrate 112. Advantageously, the circuit feature or the component may be protected by the dielectric layer 122 from debris, dirt, conductive particles and surrounding conductors or electrical devices which might otherwise interfere with the proper operation of the circuit assembly 100.

FIG. 5 is a cross-sectional view of the circuit assembly 100 of FIG. 4 taken along reference line 5—5. On the left side of the substrate 112, a first component 34 is mounted adjacent to and between two adjacent frame elements 18. A second component 36 and a third component 38 are mounted in an intermediate region of the substrate 112. Although the components may have virtually any size or shape, as shown in FIG. 5 the first circuit component 34 has a higher profile than the second component 36 and the third component 38.

The second component 36 is disposed at least partially underneath the integral frame 116 or at least one of the frame elements. The third component 38 is located entirely in the intervening region 120 between two adjacent integral frame members. Neither the second component 36 nor the third component 38 is visible from the top view of FIG. 4. However, the depth of the cavity formed in the intervening region 122 is less than the depth would otherwise be if the no components (i.e., the second component 36 and the third component 38) were present. For example, the depth on the second side 13 of the circuit assembly of the cavities in the intervening regions 120 is greater than the depth of the cavities associated with the second side 11 in the region of the second component 36 and the third component 38.

The fourth component 40 is located partially under one integral frame element and partially within the intervening region 120. As shown, the fourth component 40 is similar to the first component 34. Although FIG. 5 shows various examples of illustrative components with certain geometrical relationship and mounting positions relative to the substrate 112, the present invention may be practiced with a prodigious assortment of possible configurations that fall within the scope of the invention in terms of the size, shape and geometry of the components mounted on the substrate 112. The manufacturing techniques and the circuit assembly 100 of the invention afford wide latitude of geometric configurations of the substrate 112 to foster wide applicability of the invention.

Figure 6:
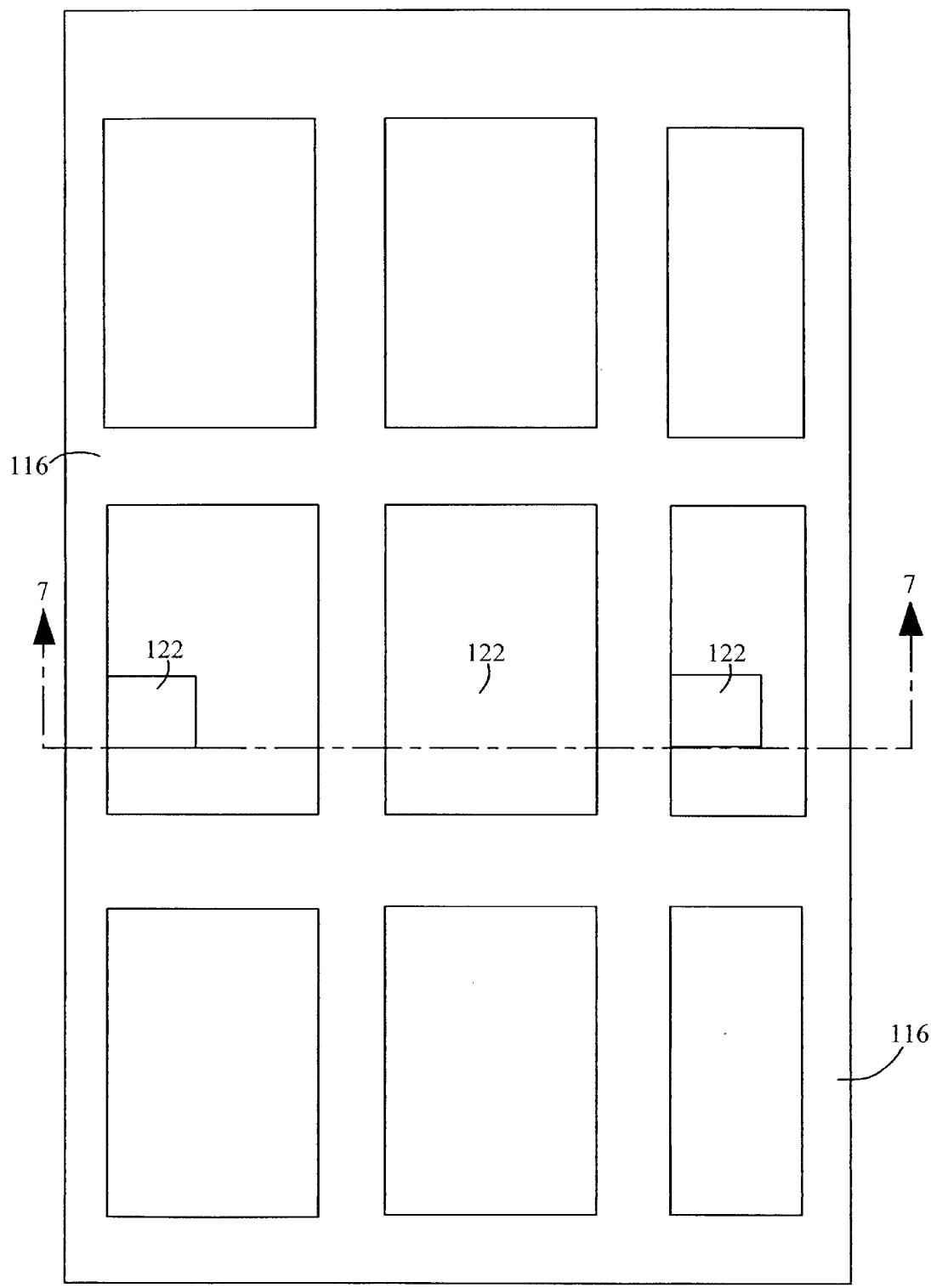
FIG. 6 is a top view of a third embodiment of a circuit assembly in accordance with the invention.
Figure 7:
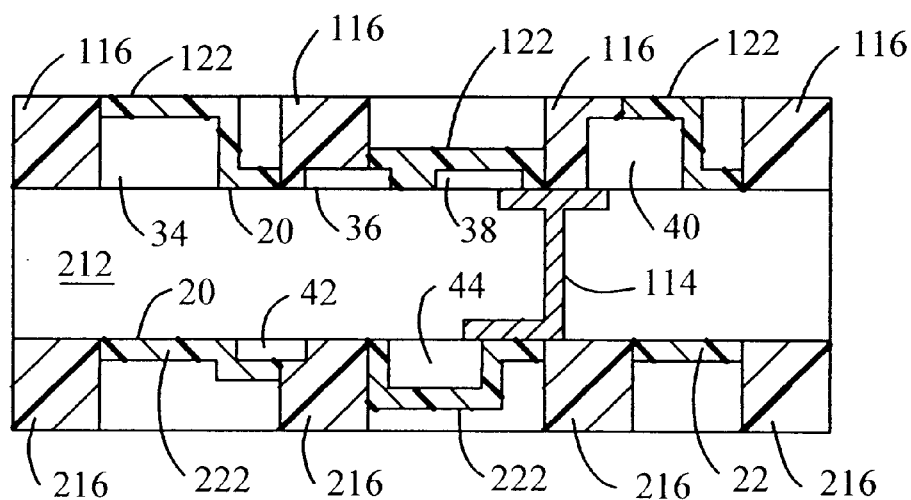
FIG. 7 shows a cross-sectional view taken along references lines 7—7 of FIG. 6.

FIG. 6 and FIG. 7 show a third embodiment of a circuit assembly 200 in accordance with the invention. The embodiment of FIG. 6 is similar to the embodiment of FIG. 1 and FIG. 4, except FIG. 6 features components mounted on both sides of the substrate 212. Like reference numbers in FIG. 1, FIG. 2, FIG. 6 and FIG. 7 are indicated by like elements.

The components of FIG. 7 on opposite sides of the substrate 212 may be encapsulated by the dielectric layer 122 and dielectric layer 222 to protect the components and the substrate 212 from damage or external influences. The use of opposite sides of the substrate 212 allows greater density of circuitry of the circuit assembly 200 and potentially smaller housings for an electronic device incorporating the circuit assembly 200.

Figure 8:
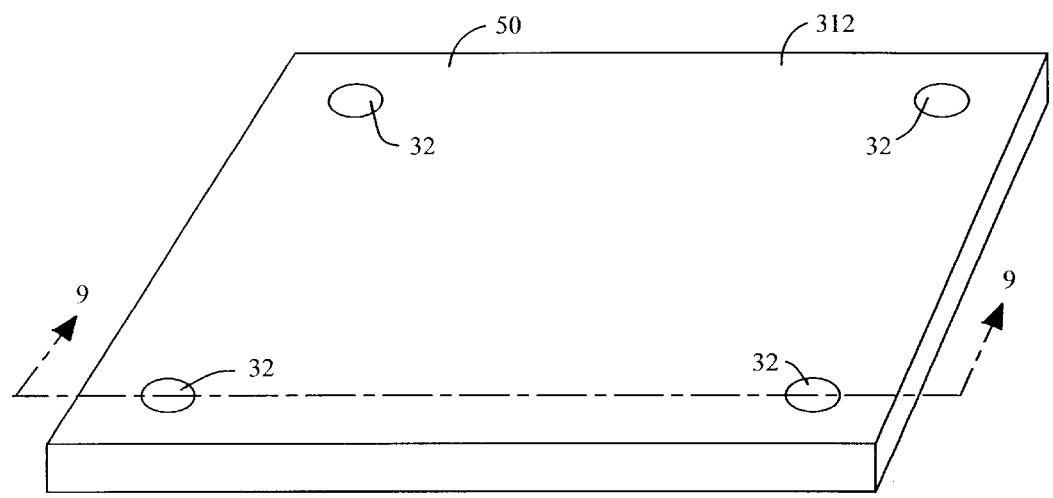
FIG. 8 shows a perspective view of an unpopulated planar substrate in accordance with the invention.

FIG. 8 shows a perspective view of a substrate 312 having alignment members 32. The alignment members 32 may refer to alignment pins or hold-down devices, for example. Although any suitable number of alignment members 32 may be used to retain the substrate 312, in FIG. 8 four alignment members 32 may be used to hold the substrate 312 in place during the molding process. A mold for formation of the frame may mate with the alignment members 32 for alignment of the substrate 312 with respect to the mold.

Figure 9:
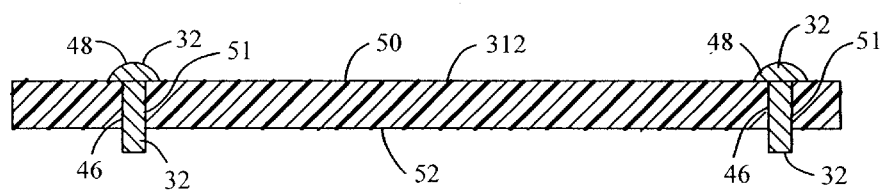
FIG. 9 shows a side view of the substrate along reference line 9—9.

FIG. 9 shows a cross-section of the substrate 312 of FIG. 8 along reference line 9—9. The substrate 312 has a first planar side 50 and a second planar side 52 opposite the first planar side 50. The substrate 312 may have bores or holes 51 for receiving the alignment members 32.

Each alignment member 32 may have a head 48 that extends from a shaft 46. The head 48 may be domed, generally hemispherical, curved, or otherwise shaped. The shaft 46 may be generally cylindrical or threaded. The alignment members 32 may be placed in holes 51 within the substrate 412 such that the lower portion of the head 48 is flush with a first planar surface 50 of the substrate 412 while the upper portion of the head 48 protrudes above the substrate 412. The shaft 46 of the alignment member 32 may extend through the substrate 412 such that the shaft 46 extends beyond a second planar surface 52 of the substrate 412.

Figure 10:
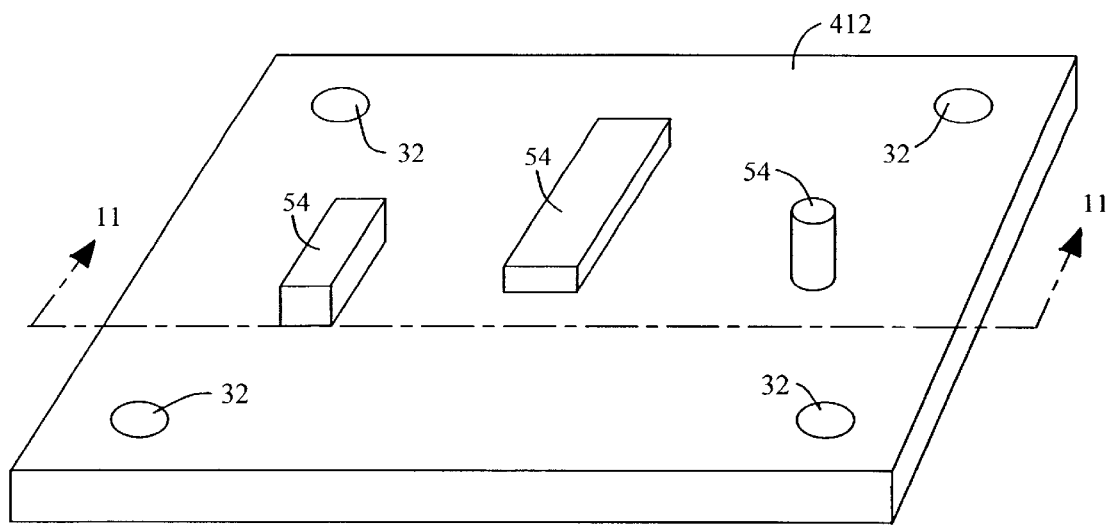
FIG. 10 shows a populated substrate having alignment members in accordance with the invention.
Figure 11:
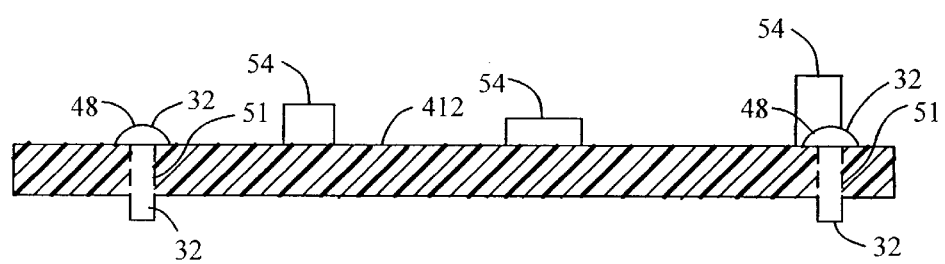
FIG. 11 is a cross-sectional view in accordance with FIG. 10 taken along reference line 11—11.

The substrate 312 of FIG. 8 and FIG. 9 represents an unpopulated substrate, whereas the substrate of FIGS. 10 and 11 represents a populated substrate 312. Like reference numbers in FIGS. 8–11 indicate like elements. The substrate 412 of FIG. 10 is populated with components 54 such as electrical components 54, electronic components 54, discrete components, semiconductors, resistors, capacitors or other components or circuit features. FIG. 11 shows a cross-sectional view of the substrate 412 that is populated with the components 54 along reference line 11—11.

Figure 12:
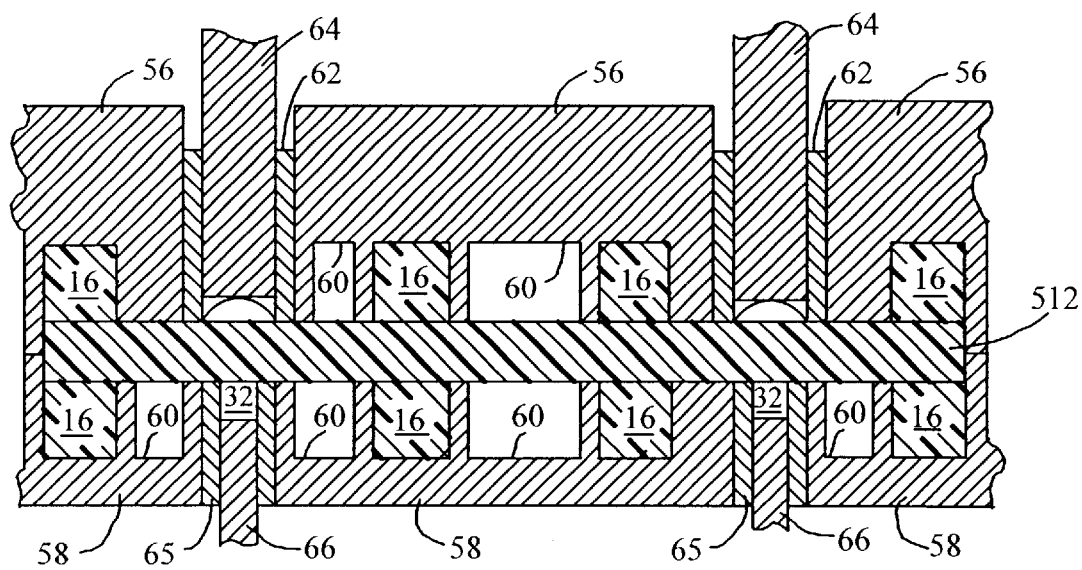
FIG. 12 shows a cross-sectional view of a circuit board assembly during formation within a mold in accordance with invention.

FIG. 12 shows a cross-sectional view of a substrate 512 of FIG. 10 while the integral frame 16 of FIG. 12 is being formed within a molding apparatus. The molding apparatus of FIG. 12 was configured for forming at least the integral frame 16. The molding apparatus may support the formation of the dielectric layer (e.g., dielectric layer 22) as well as the integral frame 16. The integral frame 16 may be formed before the dielectric layer consistent with FIG. 12.

The molding apparatus of FIG. 12 comprises two mold sections, called a first mold section 56 and a second mold section 58. The mold sections (56, 58) represent female molds for formation of the integral frame (e.g., integral frame 16). Each mold section (56, 58) may have a plurality of voids 60 or channels for allotting space to components 54 for mounting on the substrate 512. FIG. 12 shows a cross-section of frame components. In one embodiment, the frame components are formed of a polymeric material, a plastic, a plastic composite, a polymeric composite, or the like. The frame elements of the integral frame are formed at defined locations that are defined with reference to the alignment members 32. The alignment members 32 facilitate alignment of the first mold section 56 of the mold and the second mold section 58 of the mold with defined orientations with respect to the substrate 512.

The substrate 512 may be populated or unpopulated when placed within the mold. Where the substrate 512 is to be populated or is populated with components the mold preferable has hollow regions, cavities, channels, or voids 60 to allow clearance between the cavity 60 and the component 54. For example, the cavity 60 may have a larger volume than the component 54, while tracking the general shape of the component 54. Accordingly, when the two sections (56, 58) of the molds are brought together, a clearance remains around the components that populate the substrate 512. The components 54 may be exposed or partially exposed after formation of the integral frame 16 such that the components 54 may be covered or encapsulated by a dielectric layer.

The first mold section 56 and the second mold section 58 may have holes for accepting a first sleeve 62 and a second sleeve 65, respectively. The first mold section 56 may contain a first sleeve 62 for alignment with a head of the alignment member 32, for example, or a protruding of the alignment member. A first shaft 64 may mate slidably with the first sleeve 62 to permit the first mold section 56 to be removed or extracted from the substrate 512, such that the substrate 512 or the circuit assembly can be free from the first mold section 56. The second mold section 58 may contain a second sleeve 65 for alignment with a head of the alignment member 32, for example, or a protruding of the alignment member. A second shaft 66 may mate slidably with the second sleeve 65 to permit the first mold section 56 to be removed or extracted from the substrate 512, such that the substrate 512 or the circuit assembly can be free from the second mold section 58.

As shown in FIG. 12, four shafts (64, 66) are associated with the alignment members 32. Two first shafts 64 are associated with a first mold section 56 and two second shafts 66 are associated with a second mold section 58. If a downward force is applied to the first shafts, then the first mold section 56 may be freed or separated from the substrate 512 having the molded frame 16. Similarly, if an upward force is applied to the second shafts 66 associated with a second mold section 58 of the mold, the substrate 512 may be freed or separated from a second mold section 58 of the mold.

During the molding of a frame 16 for the substrate 512, the substrate 512 is positioned between two halves of a mold. A polymeric precursor or resin may be introduced or injected between the sections (56, 58) of the mold. The substrate 512 must be properly aligned with respect to the sections (56, 58) of the mold. The substrate 512 must be properly aligned with respect to the mold sections (56, 58) to provide a proper electrical insulating intermounting configuration for the finished circuit assembly. Alignment members 32 or other hold-down features may align the substrate 512 with respect to the mold sections (56, 58). The number of the alignment members 32 may be selected to support a flexible substrate as the substrate 512 adequately during the molding process to avoid molding the substrate 512 in a warped or buckled state. Thus, the frame geometry of the molded frame 16 requires less molding pressure than conventional encapsulation techniques; hence, less deformation of flexible substrate 512 is possible. Although not shown, the first mold section and the second mold section may be movable up and down in at least one vertical plane to allow the substrate 512 with the molded frame to be removed from the mold.

Figure 13:
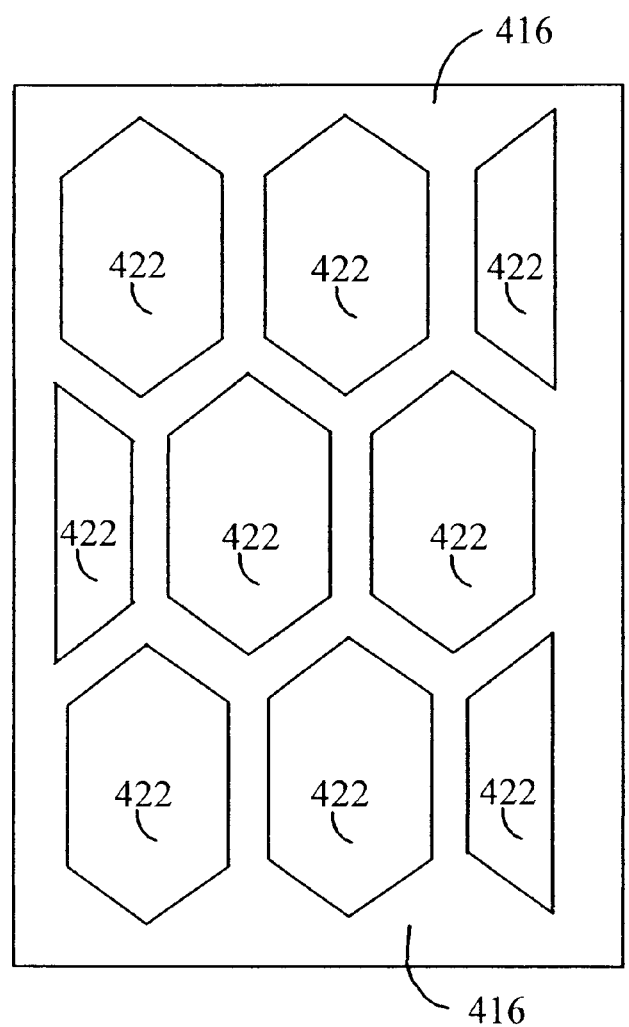
FIG. 13 shows an alternate embodiment of an integral frame for formation about a substrate in accordance with the invention.

FIG. 13 provides an alternate configuration of a frame 416 in accordance with the invention. The frame of FIG. 13 may feature intervening regions 422 that are generally polygonal. The intervening regions 422 of FIG. 13 differ from the intervening regions of FIG. 1 in that the intervening regions of FIG. 13 are generally hexagonal or some other configuration with more than four sides as shown in FIG. 1. The configuration of FIG. 13 illustrates hexagonal intervening regions even for an unpopulated substrate.

The method for making the circuit assembly, and the circuit assembly may readily be applied to unpopulated substrates, populated single-sided substrate and populated double-sided substrates. Any embodiment of the integral frame described herein may provide structural rigidity and structural support to inhibit or eliminate bending of the substrate during the manufacturing of the circuit assembly. For example, the integral frame may prevent the substrate from bending, flexing or deforming during molding of the frame. Because of the construction of the integral frame in which the intervening portions of the substrate are exposed, the integral frame may be formed with the application of a lesser molding pressure than would otherwise be necessary to encapsulate the entire substrate. Accordingly, the lesser molding pressure associated with formation of the frame reduces bending, warpage, and distortion of the substrate and increases the reliability of the finished circuit assembly.

The foregoing description of the circuit assembly describes several illustrative examples of the invention. Modifications, alternative arrangements and variations of these illustrative examples are possible and may fall within the scope of the invention. Accordingly, the following claims should be accorded the reasonably broadest interpretation, which is consistent with the specification disclosed herein and not unduly limited by aspects of the preferred embodiments and other examples disclosed herein.

What is claimed is:

1. A method for making a circuit assembly, the method comprising:

providing a substrate comprising one or more conductors and a circuit feature;

forming an integral frame of frame elements about the substrate to provide structural support for the substrate, the frame elements spaced apart to expose intervening regions of the substrate between adjacent frame elements, wherein the one or more conductors and the circuit feature are positioned on the exposed intervening regions; and constructing a dielectric layer, over the intervening regions, as a protective barrier for at least one of the conductors and the circuit feature of the substrate, wherein the dielectric layer does not substantially extend exteriorly of the frame elements.

2. The method according to claim 1 wherein the providing comprises:

providing a lead frame as the substrate, the lead frame arranged to support a semiconductor device.

3. The method according to claim 1 wherein the forming comprises:

molding the integral frame as a lattice structure.

4. The method according to claim 1 wherein the forming comprises:

molding the integral frame composed of at least one of a polymer and rigid a plastic material.

5. The method according to claim 1 wherein the constructing comprises:

forming the dielectric layer of a dielectric thickness that is thinner than a frame thickness of the frame.

6. The method according to claim 1 wherein the constructing comprises:

forming the dielectric layer composed of at least one of flexible polymer and an elastomer.

7. The method according to claim 1 wherein providing the substrate comprises providing a flexible substrate that permits flexing of the substrate from a generally planar shape upon exposure to mechanical stress from a conventional molding process.

8. The method according to claim 1 wherein the forming comprises molding a portion of the frame as a rigid structure along at least an edge of the substrate.

9. The method according to claim 1 wherein the forming comprises molding a web having a group of ribs as frame elements for holding the substrate in place.

10. The method according to claim 1 wherein the providing comprises providing a substrate having at least two alignment members for aligning mold sections with respect to the substrate for formation of the frame in a defined orientation with respect to the substrate.

11. The method according to claim 1, wherein no dielectric layer is formed upon the frame.

12. The method according to claim 1, further comprising forming a second integral frame of frame elements about a side of the substrate that is opposite to a side of the substrate that includes the integral frame, the frame elements of the second integral frame spaced apart to expose a second set of intervening regions of the substrate between adjacent frame elements of the second integral frame, wherein a second set of one or more conductors and a circuit feature of the substrate are positioned on the exposed second set of intervening regions; and constructing a second dielectric layer, over the second set of intervening regions, as a protective barrier for at least one of the second set of one or more conductors and the circuit feature of the substrate.

13. The method according to claim 12, wherein the second dielectric layer does not substantially extend exteriorly of the frame elements of the second integral frame.

* * * * *

UNITED STATES PATENT AND TRADEMARK OFFICE
CERTIFICATE OF CORRECTION

PATENT NO.    : 6,748,650 B2
DATED         : June 15, 2004
INVENTOR(S)   : Harvinder Singh It is certified that error appears in the above-identified patent and that said Letters Patent is hereby corrected as shown below:

Column 7,
Line 35, after "dielectric layer," insert -- directly on and --.
Line 37, before "conductors" insert -- one or more --.

Signed and Sealed this

Ninth Day of November, 2004

JON W. DUDAS
*Director of the United States Patent and Trademark Office*